(12) United States Patent
Bliven

(10) Patent No.: US 9,706,842 B2
(45) Date of Patent: Jul. 18, 2017

(54) DISPLAY DEVICE MOUNT ADAPTER

(71) Applicant: Hewlett-Packard Development Company, L.P., Houston, TX (US)

(72) Inventor: Robert P. Bliven, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/764,802

(22) PCT Filed: Jan. 31, 2013

(86) PCT No.: PCT/US2013/024201
§ 371 (c)(1),
(2) Date: Jul. 30, 2015

(87) PCT Pub. No.: WO2014/120219
PCT Pub. Date: Aug. 7, 2014

(65) Prior Publication Data
US 2015/0359337 A1 Dec. 17, 2015

(51) Int. Cl.
*H05K 5/02* (2006.01)
*A47B 97/00* (2006.01)
*F16M 13/02* (2006.01)
*H05K 5/00* (2006.01)

(52) U.S. Cl.
CPC .......... *A47B 97/001* (2013.01); *F16M 13/02* (2013.01); *H05K 5/0017* (2013.01); *H05K 5/0204* (2013.01)

(58) Field of Classification Search
CPC .. A47B 97/001; H05K 5/0017; H05K 5/0204; H05K 5/00; F16M 13/02; G06F 1/16; G06F 1/1601; G06F 1/1613; G06F 1/1633; G06F 1/1679; G06F 1/166

USPC ........... 361/679.01, 679.02, 679.21, 679.22, 361/679.26, 679.55, 679.57, 679.58, 361/679.59, 679.6, 681, 682, 683, 807, 361/809; 248/917–923
See application file for complete search history.

(56) References Cited

U.S. PATENT DOCUMENTS

| 4,229,892 A | 10/1980 | Hueter et al. |
| 4,882,868 A | 11/1989 | Fast |
| 5,549,376 A | 8/1996 | Domenig |
| 6,263,625 B1 | 7/2001 | LaPointe |

(Continued)

FOREIGN PATENT DOCUMENTS

| CN | 2479550 | 2/2002 |
| CN | 1482621 | 3/2004 |

(Continued)

OTHER PUBLICATIONS

"Cantilever 23-46" 100Lbs Flat Panel LCD LED Plasma TV Wall Mount Bracket Black," 2012, pp. 1-3, Tmart.com, Inc.

(Continued)

*Primary Examiner* — Courtney Smith
*Assistant Examiner* — Sagar Shrestha
(74) *Attorney, Agent, or Firm* — Dicke, Billig & Czaja, PLLC

(57) ABSTRACT

A display device mount adapter includes a mounting plate having a mounting interface, and an engagement tongue connected to and spaced from the mounting plate, such that the engagement tongue is to engage a slot of a display device to secure the mount adapter to the display device.

19 Claims, 13 Drawing Sheets

(56) References Cited

U.S. PATENT DOCUMENTS

| | | | |
|---|---|---|---|
| 6,434,871 B2 | 8/2002 | Conway | |
| 7,434,774 B1* | 10/2008 | Floersch | F16M 11/08 248/183.1 |
| 7,448,584 B2* | 11/2008 | Chen | F16M 11/10 248/122.1 |
| 7,593,219 B2* | 9/2009 | Quijano | F16M 11/04 248/923 |
| 7,796,772 B2* | 9/2010 | Takahashi | H04R 1/2819 361/679.23 |
| 7,866,621 B1* | 1/2011 | Walters | F16M 11/08 248/421 |
| 8,418,861 B1* | 4/2013 | Weaver | A47B 96/06 211/208 |
| 8,490,931 B2* | 7/2013 | Takao | F16M 11/22 108/150 |
| 2004/0118987 A1 | 6/2004 | Matko et al. | |
| 2004/0155166 A1 | 8/2004 | Kim | |
| 2005/0051692 A1* | 3/2005 | Jung | F16M 11/10 248/371 |
| 2006/0076463 A1 | 4/2006 | Drew | |
| 2006/0250347 A1* | 11/2006 | Bertoncini | G06F 1/1601 345/103 |
| 2007/0235614 A1* | 10/2007 | O'Keene | F16M 13/02 248/309.1 |
| 2007/0290102 A1 | 12/2007 | Kim | |
| 2008/0287009 A1 | 11/2008 | McCoy | |
| 2009/0101777 A1* | 4/2009 | Kim | F16M 13/02 248/220.21 |
| 2009/0185341 A1* | 7/2009 | Jang | F16M 11/041 361/679.22 |
| 2009/0294605 A1* | 12/2009 | Smith | A47B 81/06 248/158 |
| 2010/0208420 A1* | 8/2010 | Yang | F16M 11/041 361/679.01 |
| 2011/0075345 A1* | 3/2011 | Moscovitch | F16M 11/04 361/679.22 |
| 2011/0163215 A1 | 7/2011 | Walters | |
| 2011/0180674 A1* | 7/2011 | Bliven | F16M 11/00 248/121 |
| 2011/0302865 A1 | 12/2011 | Kliegle et al. | |
| 2012/0234994 A1 | 9/2012 | Chen et al. | |
| 2013/0044411 A1* | 2/2013 | Zhen | F16M 11/041 361/679.01 |
| 2013/0114196 A1* | 5/2013 | Chen | G02F 1/133308 361/679.01 |
| 2013/0161464 A1* | 6/2013 | Lin | F16M 11/10 248/278.1 |
| 2013/0301216 A1* | 11/2013 | Trinh | A47F 7/0246 361/679.58 |
| 2014/0036199 A1* | 2/2014 | Ka | G06F 1/1601 349/58 |
| 2014/0166333 A1* | 6/2014 | Porcano | H02G 3/14 174/66 |

FOREIGN PATENT DOCUMENTS

| | | | |
|---|---|---|---|
| CN | 1767734 | 5/2006 | |
| CN | 101094572 | 12/2007 | |
| CN | 201666437 | 12/2010 | |
| CN | 102384348 | 3/2012 | |
| JP | WO 2012/140773 | * 10/2012 | ........... G06F 1/1601 |

OTHER PUBLICATIONS

International Search Report and Written Opinion, International Application No. PCT/US2013/024201, Date of Mailing: Oct. 29, 2013, pp. 1-10.

* cited by examiner

DISPLAY DEVICE MOUNT ADAPTER

BACKGROUND

A flat display device, such as a flat panel monitor or a flat TV, may be supported by a stand or mounted on a supporting structure, such as a wall mount bracket or an articulating arm. To avoid increasing a thickness of the flat display device, built-in mounting studs may be exclude from the flat display device. Such exclusion, however, may limit a mounting capability of the flat display device.

DETAILED DESCRIPTION

In the following detailed description, reference is made to the accompanying drawings which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples of the present disclosure can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

Figure 1A:
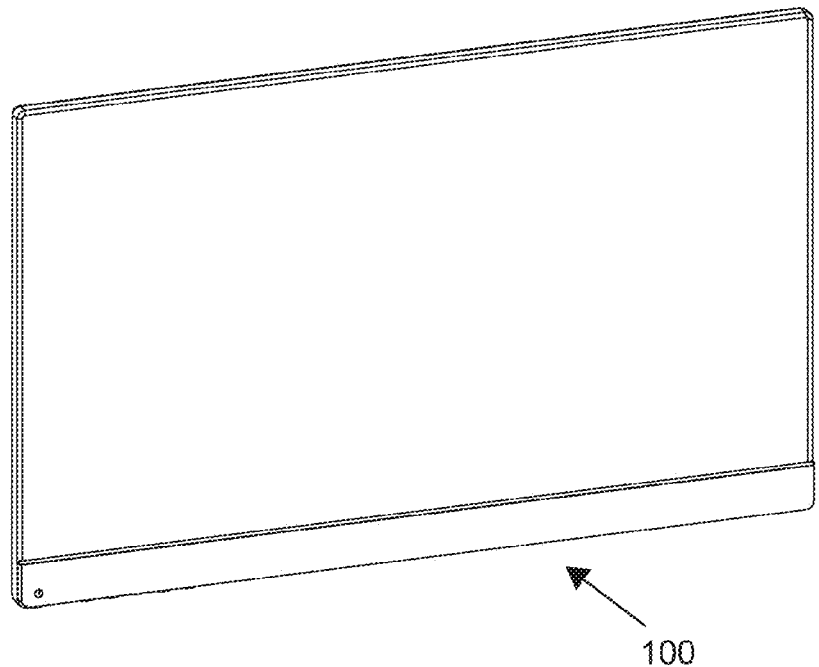
FIGS. 1A and 1B illustrate front and rear perspective views of one example of a display device.
Figure 1B:
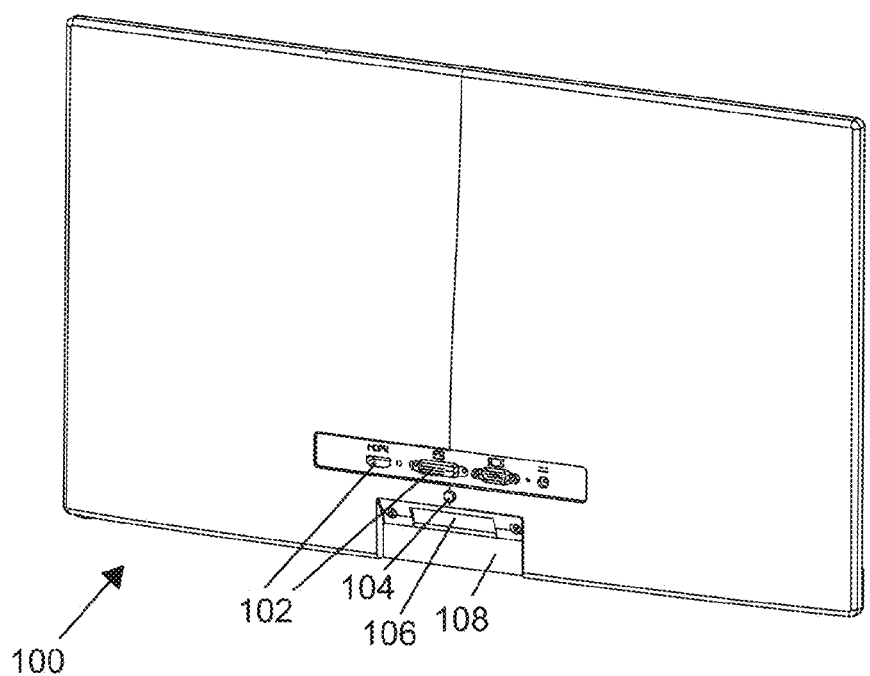

FIGS. 1A and 1B illustrate front and rear perspective views, respectively, of one example of a display device 100. Display device 100 includes an example of a flat display, and may include, for example, a monitor, a display, a TV, etc. In one implementation, one or more connectors 102 are provided on or at a rear or back of display device 100 to facilitate connection of one or more electrical (or optical) cables (for example, for power, data, audio, video, etc.) to display device 100. As described herein, a mount adapter facilitates mounting of display device 100 on or to a supporting object or structure such as, for example, a wall, a wall mount or bracket, an arm, a stand, or other mounting structure.

Figure 2A:
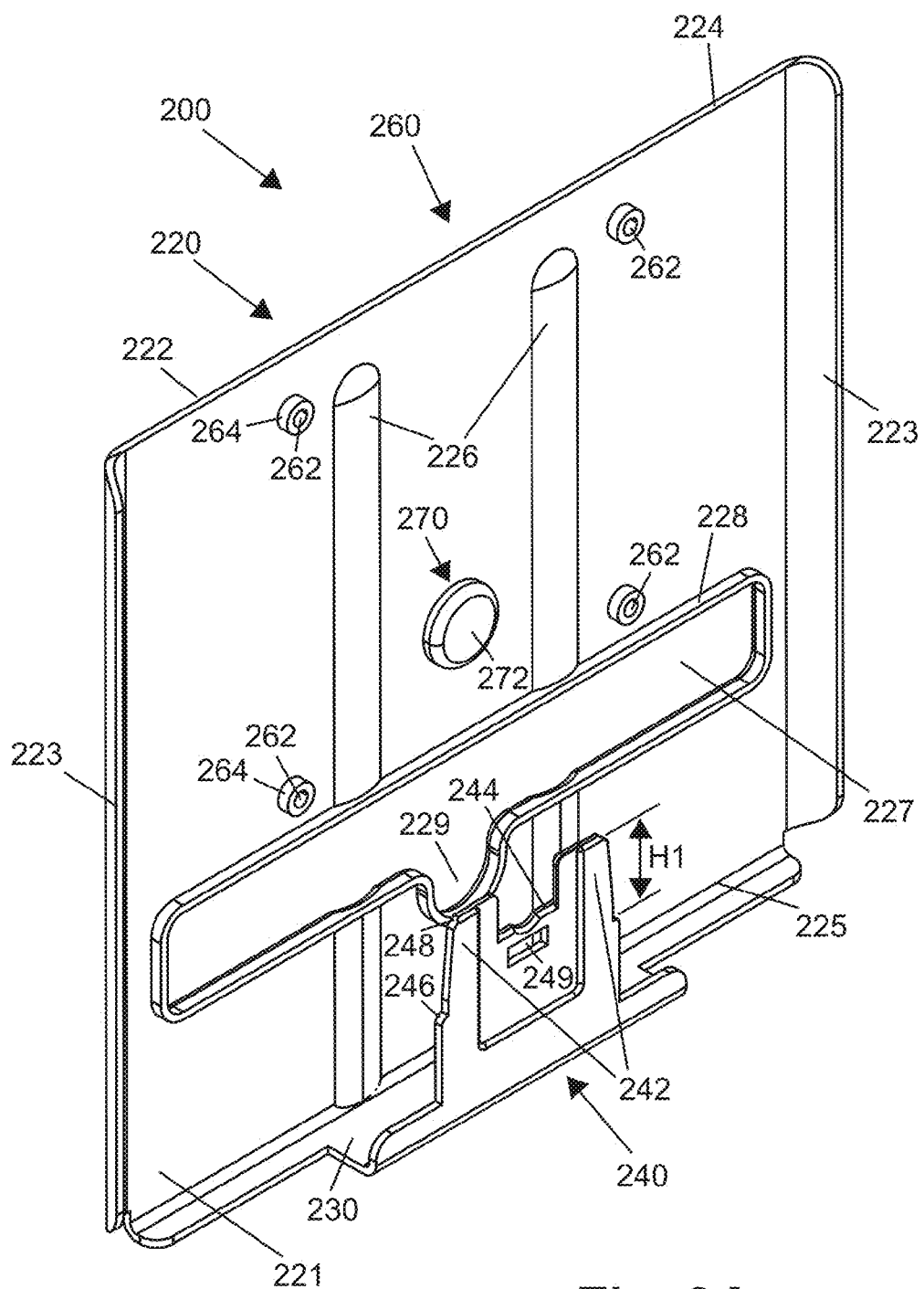
FIGS. 2A and 2B illustrate front and rear perspective views of one example of a mount adapter for a display device.
Figure 2B:
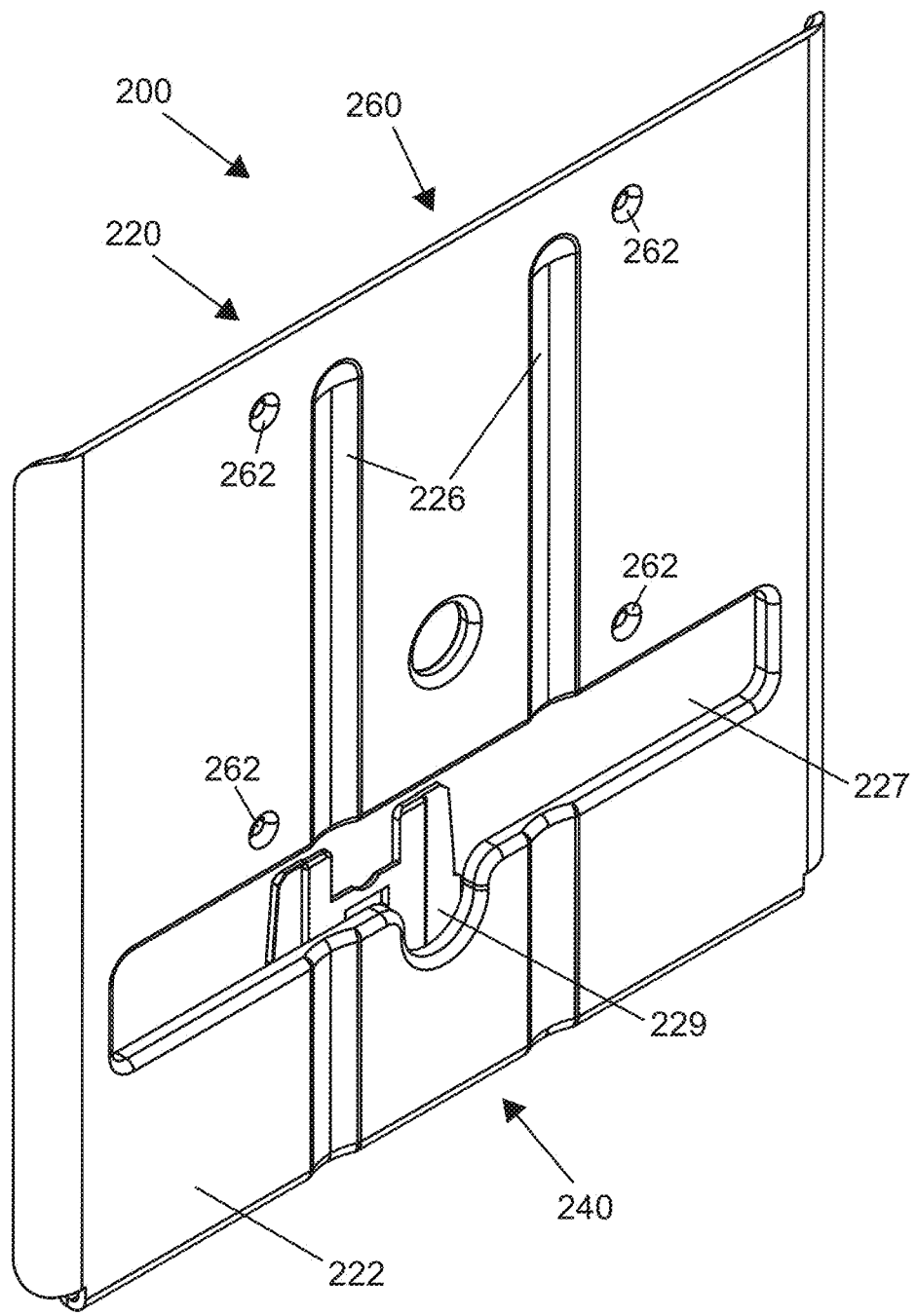

FIGS. 2A and 2B illustrate front and rear perspective views, respectively, of one example of a mount adapter 200 for a display device, such as display device 100. As described herein, mount adapter 200 provides an adapter or bracket for mounting of a display device on or to a supporting object or structure such as, for example, a wall, a wall mount or bracket, an arm, a stand, or other mounting structure.

In one implementation, mount adapter 200 includes a mounting plate 220 and an engagement tongue 240. Mounting plate 220 forms an adapter plate for mounting of a display device, and includes a mounting interface 260, as described below. Engagement tongue 240 is connected to or coupled with mounting plate 220 and provides for releasably securing or attaching mount adapter 200 to a display device, as described below.

As illustrated in the example of FIGS. 2A and 2B, mounting plate 220 includes a front surface 221 and a rear surface 222, lateral sides or edges 223, and top and bottom edges 224 and 225. Front surface 221 faces and is provided adjacent to a back surface of a display device when mount adapter 200 is secured or attached to (i.e., installed on) a display device, as described below. Rear surface 222 provides a planar mounting surface or region for connection to or support by a supporting object or structure, as described below.

In one implementation, sides or edges 223 include rolled edges to provide additional stiffness to mounting plate 220. In addition, in one implementation, one or more ribs 226 are formed or provided in mounting plate 220 to provide additional stiffness to mounting plate 220. In one example, ribs 226 are formed or provided within or adjacent to a mounting region of mounting plate 220, and are oriented substantially parallel with each other and substantially parallel with sides or edges 223. As such, rolled edges at sides or edges 223 and/or ribs 226 provide additional stiffness to mounting plate 220 such that mounting plate 220 may be formed of a thinner material.

In one implementation, mounting interface 260 includes a multi-hole mounting interface or pattern. For example, mounting interface 260 includes multiple mounting holes 262 formed in or through mounting plate 220 to provide one or more mounting patterns. In one example, mounting interface 260 includes four mounting holes arranged or arrayed in a 2×2 pattern. Although illustrated and described as a four-hole pattern, it is understood that mounting interface 260 may include other quantities or arrangements of mounting holes (for example, six mounting holes). In one example, mounting holes 262 include corresponding standoffs 264 formed or provided on front surface 221. As such, in one example, mounting holes 262, in combination with standoffs 264, include pierced and tapped and threaded holes for receiving mating fasteners (for example, screws) for securing or attaching mount adapter 200 (and a supported or attached display device) to a supporting object or structure.

In one example, mounting interface 260 includes a multi-hole mounting interface in accordance with a Video Electronics Standards Association (VESA) Flat Display Mounting Interface (FDMI) standard. The VESA FDMI standard defines a set of corresponding standards that describe interface mounts or mounting pads, brackets, or other mounting apparatus to be provided, for example, by mounting equipment manufacturers. Thus, in one implementation, mounting interface 260 of mounting plate 220 provides mount adapter 200 with VESA mounting capability.

In one example, mounting plate 220 has an opening 227 therein to facilitate connector access and cable pass through.

More specifically, opening 227 is formed or provided through mounting plate 220 so as to provide access to connectors of a display device, such as connectors 102 of display device 100 (FIG. 1B), and to allow pass through of cables, such as cables 110 (FIG. 7A), connected to the connectors.

In one implementation, connector access and cable pass-through opening 227 is aligned with connectors of a display device, such as connectors 102 of display device 100, so as to encompass or surround the connectors when mount adapter 200 is secured or attached to the display device, as described below. In addition, in one implementation, a flange 228 is formed or provided around a perimeter of opening 227 to provide additional stiffness to mounting plate 220 in an area or region of opening 227.

In one example, mounting plate 220 has a hole or opening 229 therein to facilitate release of mount adapter 200 from a display device. More specifically, hole or opening 229 is formed or provided through mounting plate 220 to provide access to a release or detach button of a display device, such as a release button 104 of display device 100 (FIG. 1B), to remove or detach (i.e., uninstall) mount adapter 200 from a display device.

In one implementation, release opening 229 is combined with connector access and cable pass-through opening 227 such that openings 227 and 229 form a unitary opening. As such, in one implementation, flange 228 is formed or provided around a combined perimeter of openings 227 and 229 to provide additional stiffness to mounting plate 220 in an area or region of openings 227 and 229.

In one example, mounting plate 220 includes a mounting cushion 270. Mounting cushion 270 is provided on front surface 221 of mounting plate 220 within a central region of mounting plate 220 and contacts a back surface of a display device when mount adapter 200 is secured or attached to a display device, as described below. As such, mounting cushion 270 provides pressure between mounting plate 220 and a back surface of the display device to help stabilize the display device and dampen potential wobble of the display device when supported by mount adapter 200. In one implementation, mounting cushion 270 includes an adhesive contact surface 272 for adhesion to a back surface of a display device so as to provide additional connection between a display device and mount adapter 200 when mount adapter 200 is secured or attached to the display device.

As illustrated in the example of FIGS. 2A and 2B, engagement tongue 240 is connected to or coupled with mounting plate 220, and spaced or offset from mounting plate 220. In addition, in one example, engagement tongue 240 extends or projects in a direction substantially parallel with mounting plate 220 and, more specifically, substantially parallel with a mounting surface of mounting plate 220, such as rear surface 222 of mounting plate 220.

Engagement tongue 240 is sized and shaped to fit within and be received by a receiving slot of a display device to secure or attach mount adapter 200 to a display device, as described below. In one implementation, engagement tongue 240 includes spaced prongs 242 and a notched portion or cutout 244 between prongs 242. As such, prongs 242 and cutout 244 mate with and/or engage corresponding features of a receiving slot of a display device, such as a receiving slot 106 of display device 100 (FIG. 1B). In one example, prongs 242 each have shoulders 246 and tips 248, and have a height H1 defined between corresponding shoulders 246 and tips 248. In one example, engagement tongue 240 is a snap-in tongue and includes an opening or slot 249 to receive a catch or a latch of a display device when mount adapter 200 is secured or attached to a display device. As described below, engagement tongue 240 may be provided with varying sizes and/or configurations to accommodate different display devices.

As illustrated in the example of FIGS. 2A and 2B, engagement tongue 240 is connected to mounting plate 220 along bottom edge 225 of mounting plate 220, and is spaced or offset from mounting plate 220 by a spacer 230. More specifically, spacer 230 extends between mounting plate 220 and engagement tongue 240 to offset engagement tongue 240 from mounting plate 220 such that engagement tongue 240 can be inserted into or received by a receiving slot of a display device, and mounting plate 220 can be positioned adjacent a back surface of the display device, as described below. In one example, mount adapter 200 is a stamped and folded sheet metal form. As such, engagement tongue 240 is integrally formed with mounting plate 220 such that mounting plate 220, engagement tongue 240, and spacer 230 are integrally coupled as a unitary structure.

Figure 3A:
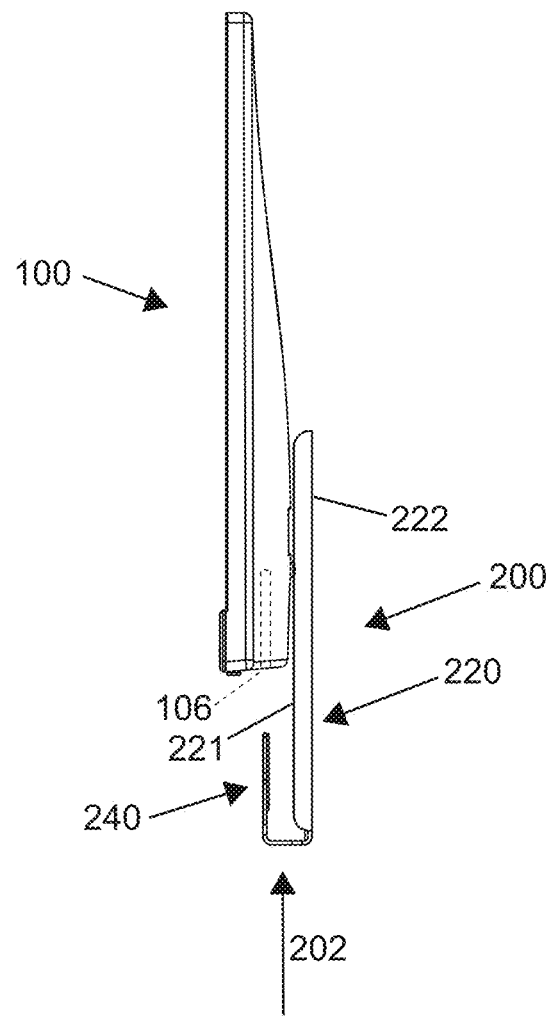
FIGS. 3A and 3B illustrate a side view and a rear perspective view of one example of securing a mount adapter to a display device.

FIG. 3A illustrates a side view of one example of securing or attaching a mount adapter, such as mount adapter 200, to a display device, such as display device 100. In one implementation, mount adapter 200 is secured or attached to (i.e., installed on) display device 100 such that front surface 221 of mounting plate 220 faces and is positioned adjacent a back surface of display device 100.

In one example, mount adapter 200 is secured or attached to display device 100 by inserting engagement tongue 240 into a receiving slot 106 of display device 100 in a direction indicated by arrow 202. As such, engagement tongue 240 is mated or engaged with receiving slot 106, and mount adapter 200 is secured or attached to display device 100 so as to be installed on display device 100. In one example, the direction indicated by arrow 202 is substantially parallel with a mounting surface of mounting plate 220, such as rear surface 222 of mounting plate 220, such that engagement tongue 240 engages receiving slot 106 of display device 100 in a direction substantially parallel with the mounting surface. In one implementation, as described above, engagement tongue 240 is a snap-in tongue such that slot 249 (FIG. 2A) of engagement tongue 240 receives a catch or latch of display device 100 when mount adapter 200 is installed on display device 100.

Figure 3B:
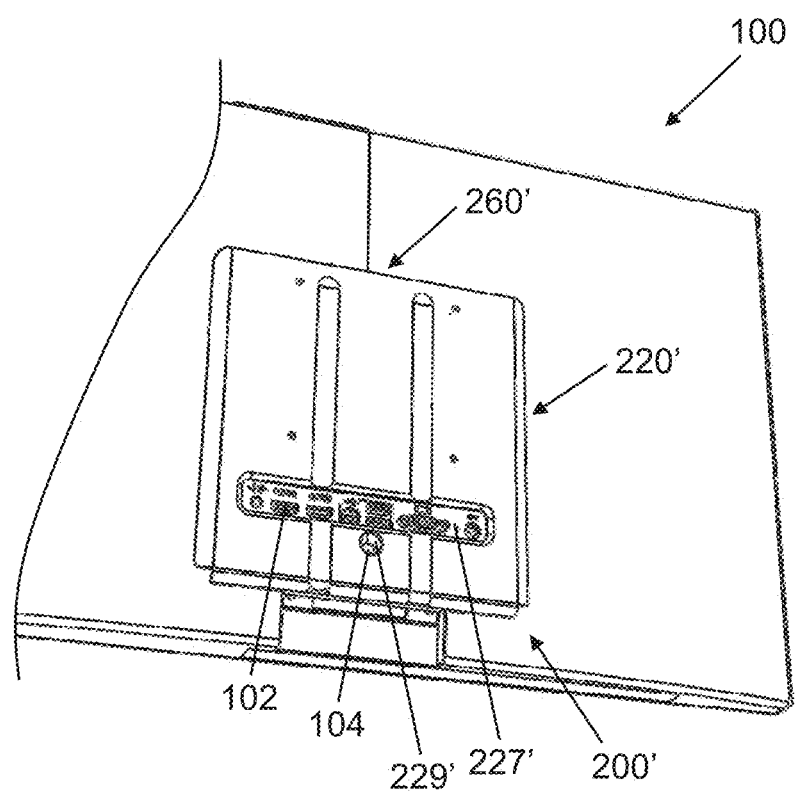

FIG. 3B illustrates a rear perspective view of one example of securing or attaching a mount adapter, such as mount adapter 200' to a display device, such as display device 100. As illustrated in the example of FIG. 3B, mount adapter 200' is similar to mount adapter 200, and includes a mounting plate 220' with a connector access and cable pass-through opening 227' and a release button opening 229' formed or provided therethrough such that opening 227' provides access to connectors 102 of display device 100 and opening 229' provides access to release button 104 when mount adapter 200' is secured or attached to display device 100. As such, one or more cables 110 (FIG. 7A) may be connected to connectors 102 of display device 100 through mounting plate 220'. In addition, mount adapter 200' may be removed or detached from display device 100 by actuating (for example, depressing) release button 104, and sliding mount adapter 200' in a direction opposite the direction indicated by arrow 202 (FIG. 3A).

In addition, similar to mounting interface 260 of mounting plate 220, mounting plate 220' includes a mounting interface 260'. Thus, with mount adapter 200' secured or attached to display device 100, mount adapter 200' provides display device 100 with a mounting interface. As such, display device 100, via mount adapter 200' and mounting interface 260', may be secured or mounted on or to a supporting object or structure such as, for example, a wall, a wall mount or bracket, an arm, a stand, or other mounting structure.

Figure 4A:
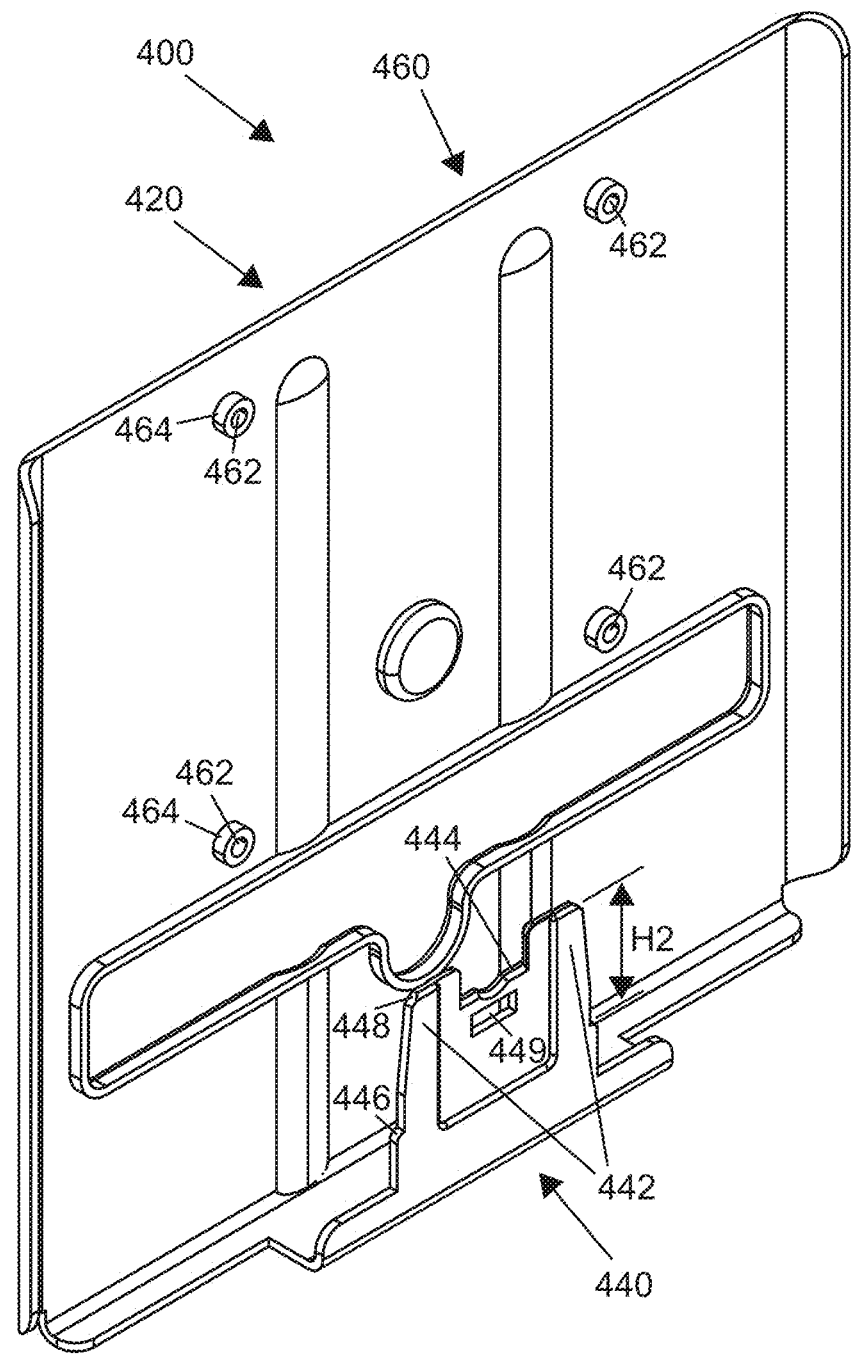
FIGS. 4A and 4B illustrate front and rear perspective views of another example of a mount adapter for a display device.
Figure 4B:
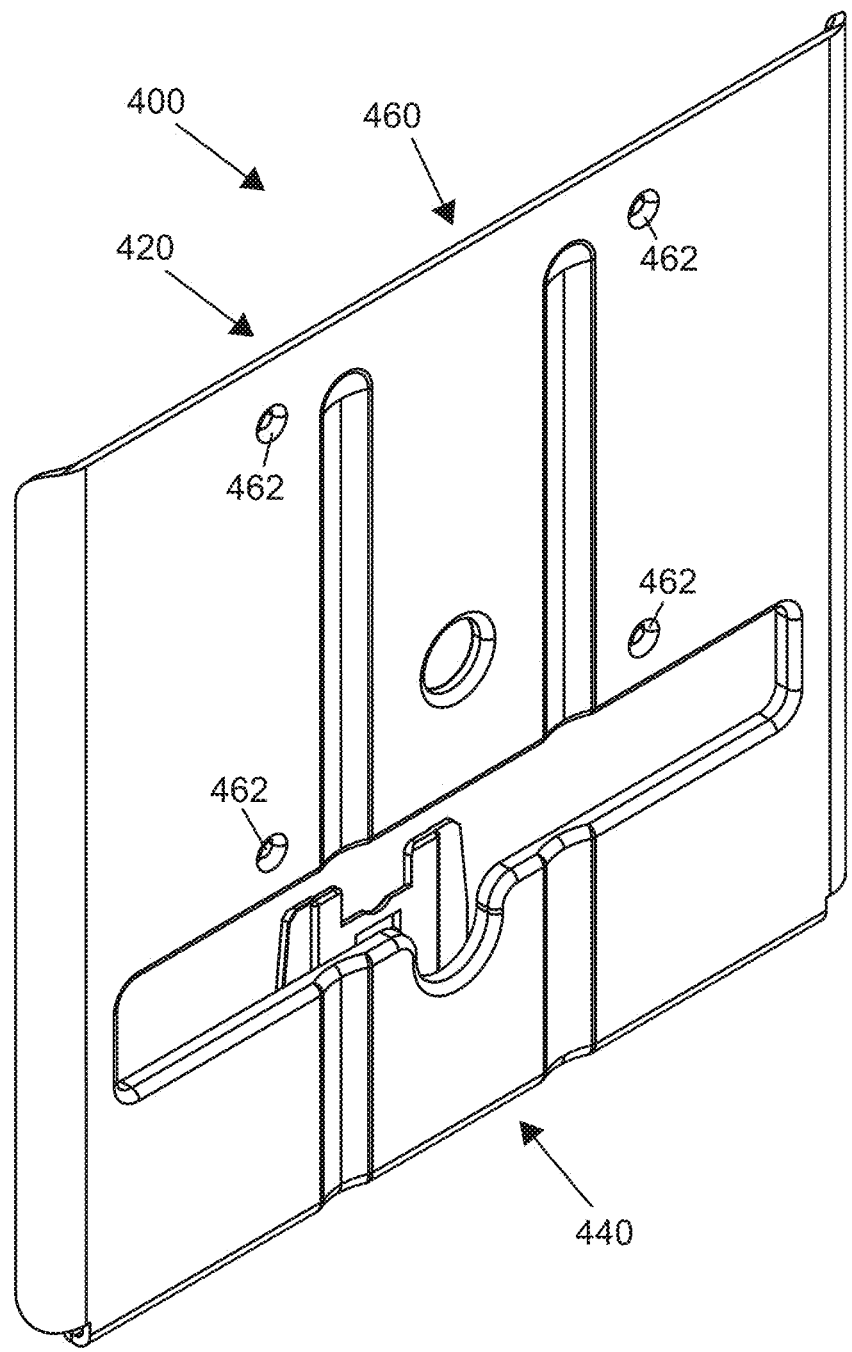

FIGS. 4A and 4B illustrate front and rear perspective views, respectively, of another example of a mount adapter 400 for a display device. Mount adapter 400 is similar to mount adapter 200 and includes a mounting plate 420 with a mounting interface 460, similar to mounting plate 220 with mounting interface 260. Mount adapter 400, however, includes an engagement tongue 440 sized and configured for a different display device (for example, a larger sized display device). In one example, engagement tongue 440 includes spaced prongs 442 and a notched portion or cutout 444 between prongs 442 with prongs 442 each having shoulders 446 and tips 448 such that a height H2 is defined between corresponding shoulders 446 and tips 448. In one example, height H2 of prongs 442 is greater than height H1 of prongs 242 such that prongs 442 of engagement tongue 440 provide for different engagement with a display device, as compared, for example, with prongs 242 of engagement tongue 240. In one implementation, engagement tongue 440 is a snap-in tongue and includes an opening or slot 449 to receive a catch or latch of a display device when mount adapter 400 is installed on a display device.

In one implementation, mounting interface 460 includes a multi-hole mounting interface or pattern, similar to that of mounting interface 260. As such, in one example, mounting interface 460 includes mounting holes 462 and corresponding standoffs 464, similar to mounting holes 462 and standoffs 464 of mounting interface 460, and provides mount adapter 400 with VESA mounting capability, as described above.

Figure 5A:
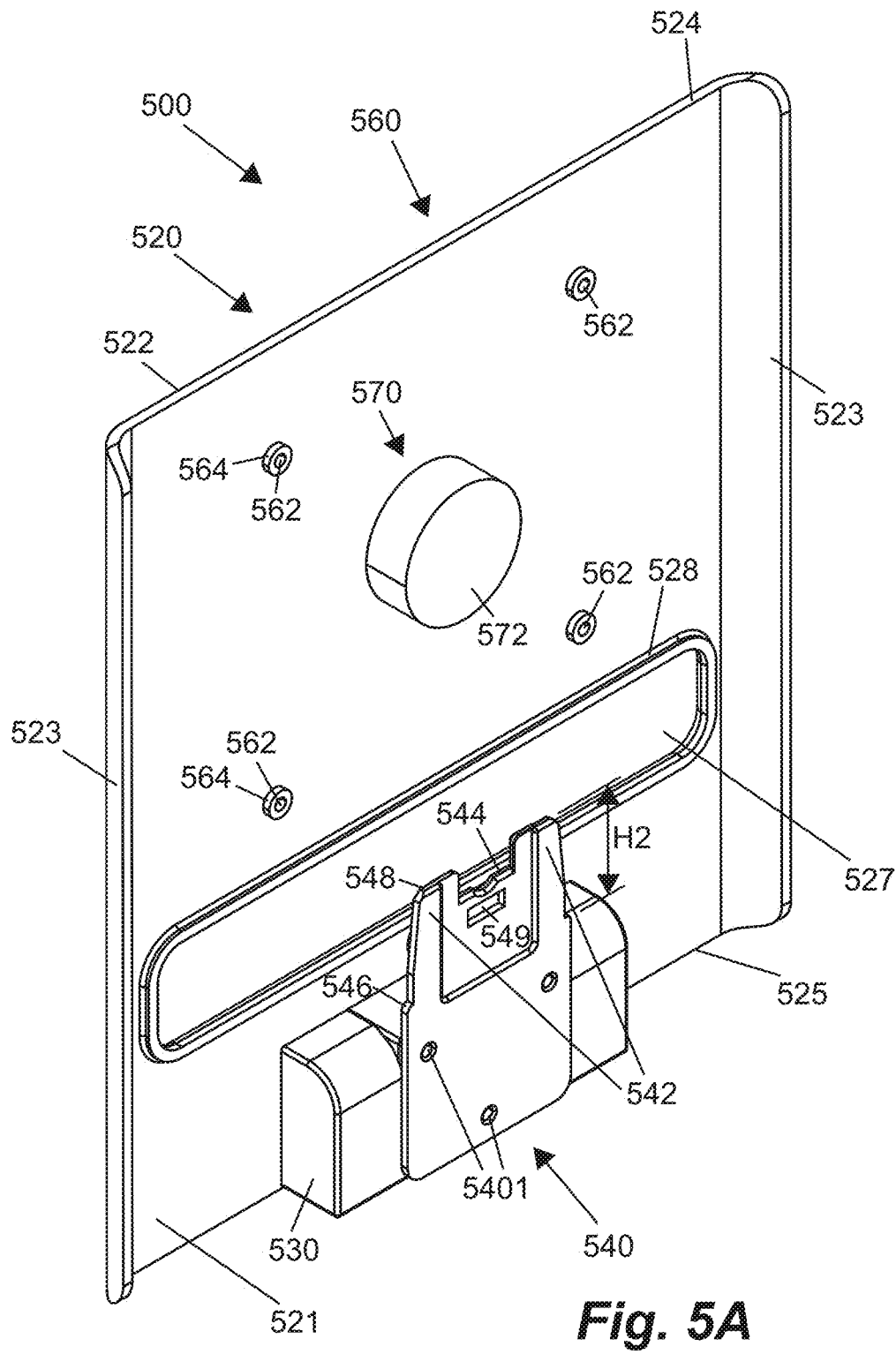
FIGS. 5A and 5B illustrate front and rear perspective views of another example of a mount adapter for a display device.
Figure 5B:
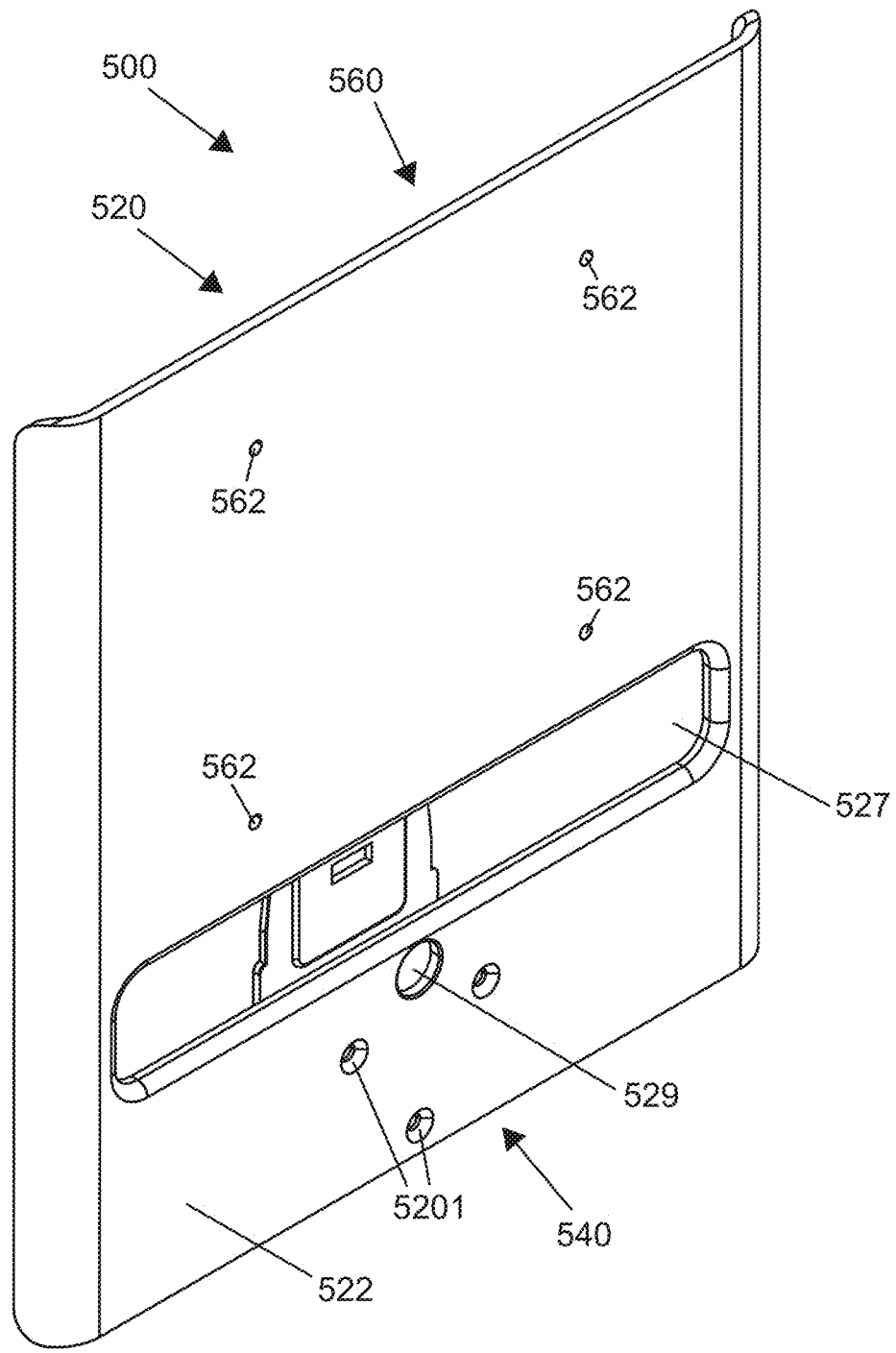

FIGS. 5A and 5B illustrate front and rear perspective views, respectively, of another example of a mount adapter 500 for a display device. Mount adapter 500 is similar to mount adapter 200 and includes a mounting plate 520 with a mounting interface 560, similar to mounting plate 200 with mounting interface 260. Engagement tongue 540 of mount adapter 500, however, is a removable engagement tongue and, in one implementation, is an interchangeable engagement tongue to accommodate different display devices, as described below.

As illustrated in the example of FIGS. 5A and 5B, mounting plate 520 includes a front surface 521 and a rear surface 522, lateral sides or edges 523, and top and bottom edges 524 and 525. Front surface 521 faces and is provided adjacent to a back surface of a display device when mount adapter 500 is secured or attached to (i.e., installed on) a display device, as described herein. Rear surface 522 provides a planar mounting surface or region for connection to or support by a supporting object or structure, as described herein.

In one implementation, mounting interface 560 includes a multi-hole mounting interface or pattern, similar to that of mounting interface 260. As such, in one example, mounting interface 560 includes mounting holes 562 and corresponding standoffs 564, similar to mounting holes 262 and standoffs 264 of mounting interface 260, and provides mount adapter 500 with VESA mounting capability, as described above.

In one example, similar to connector access and cable pass-through opening 227 of mounting plate 220, mounting plate 520 has an opening 527 formed or provided therethrough to provide access to connectors of a display device, such as connectors 102 of display device 100 (FIG. 1B). In addition, similar to release button opening 229 of mounting plate 220, mounting plate 520 has a hole or opening 529 formed or provided therethrough to provide access to a release or detach button of a display device, such as release button 104 of display device 100 (FIG. 1B). As illustrated in the example of FIGS. 5A and 5B, however, opening 527 and opening 529 are separate openings. As such, a flange 528 is formed or provided around a perimeter of opening 527 to provide additional stiffness to mounting plate 520 in an area or region of opening 527.

In one example, a mounting cushion 570 is provided on front surface 521 of mounting plate 520 within a central region of mounting plate 520. As such, mounting cushion 570 contacts a back surface of a display device when mount adapter 500 is secured or attached to a display device. In one implementation, similar to mounting cushion 270, mounting cushion 570 includes an adhesive contact surface 572 for adhesion to a back surface of a display device.

As illustrated in the example of FIGS. 5A and 5B, engagement tongue 540 is connected to or coupled with mounting plate 520, and spaced or offset from mounting plate 520. In addition, in one example, engagement tongue 540 extends or projects in a direction substantially parallel with mounting plate 520 and, more specifically, in a direction substantially parallel with a mounting surface of mounting plate 520, such as rear surface 522 of mounting plate 520.

Engagement tongue 540 is sized and shaped to fit within and be received by a receiving slot of a display device to secure or attach mount adapter 500 to a display device. In one implementation, engagement tongue 540 includes spaced prongs 542 and a notched portion or cutout 544 between prongs 542. As such, prongs 542 and cutout 544 mate with and/or engage corresponding features of a receiving slot of a display device. In one example, prongs 542 each have shoulders 546 and tips 548, and have a height H2 defined between corresponding shoulders 546 and tips 548. In one implementation, engagement tongue 540 is a snap-in tongue and includes an opening or slot 549 to receive a catch or latch of a display device when mount adapter 500 is installed on a display device.

Figure 6:
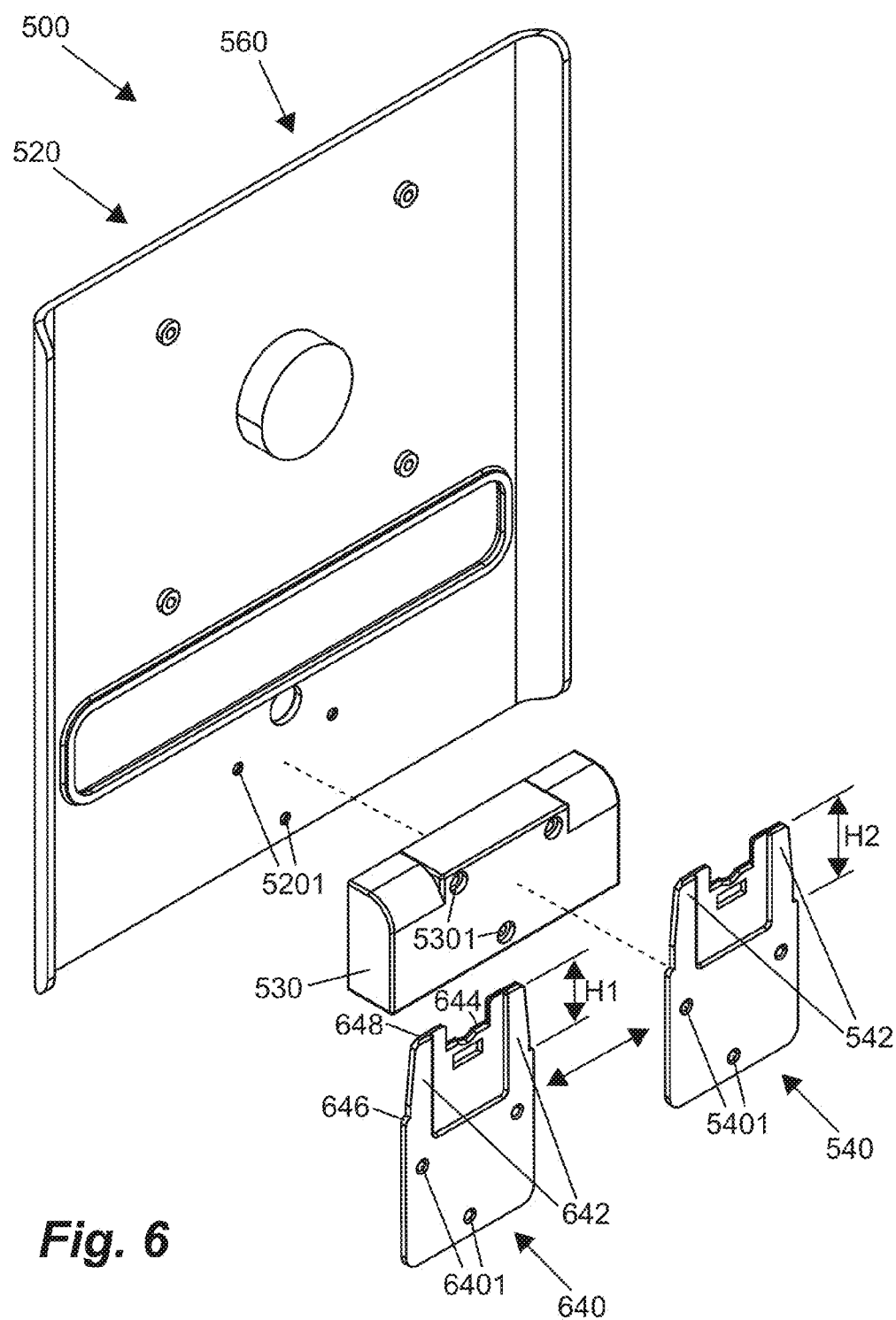
FIG. 6 illustrates an exploded view of the mount adapter of FIGS. 5A and 5B.

As illustrated in the example of FIGS. 5A and 5B, and with reference to the exploded view of FIG. 6, engagement tongue 540 is connected to mounting plate 520 along bottom edge 525 of mounting plate 520, and is spaced (or offset) from mounting plate 520 by a spacer 530. More specifically, spacer 530 is interposed between mounting plate 520 and engagement tongue 540 to offset engagement tongue 540 from mounting plate 520 such that engagement tongue 540 can be inserted into or received by a receiving slot of a display device, and mounting plate 520 can be positioned adjacent a back surface of the display device.

In one example, mounting plate 520, spacer 530, and engagement tongue 540 are joined together by fasteners extending through or into corresponding holes 5201, 5301, and 5401 (FIG. 6) of mounting plate 520, spacer 530, and engagement tongue 540. As such, engagement tongue 540 is removably coupled with mounting plate 520, and may be interchanged to accommodate different display devices, as described below.

As illustrated in the exploded view of FIG. 6, engagement tongue 540 may be interchanged to accommodate different display devices (for example, different sized display devices). More specifically, engagement tongue 540 may be exchanged with an engagement tongue 640 sized and/or configured for a different display device while mounting plate 520 and spacer 530 remain common to the different configuration. As such, mounting plate 520, spacer 530, and engagement tongue 640 are joined together by fasteners extending through or into corresponding holes 5201, 5301, and 6401 of mounting plate 520, spacer 530, and engagement tongue 640.

Engagement tongue 640 includes spaced prongs 642 and a notched portion or cutout 644 between prongs 642 with prongs 642 each having shoulders 646 and tips 648 such that a height H1 is defined between corresponding shoulders 646 and tips 648 of prongs 642. In one example, height H1 of prongs 642 is less than height H2 of prongs 542 of engagement tongue 540 such that prongs 642 of engagement tongue 640 provide for different engagement with a display device, as compared, for example, with prongs 542 of engagement tongue 540.

Figure 7A:
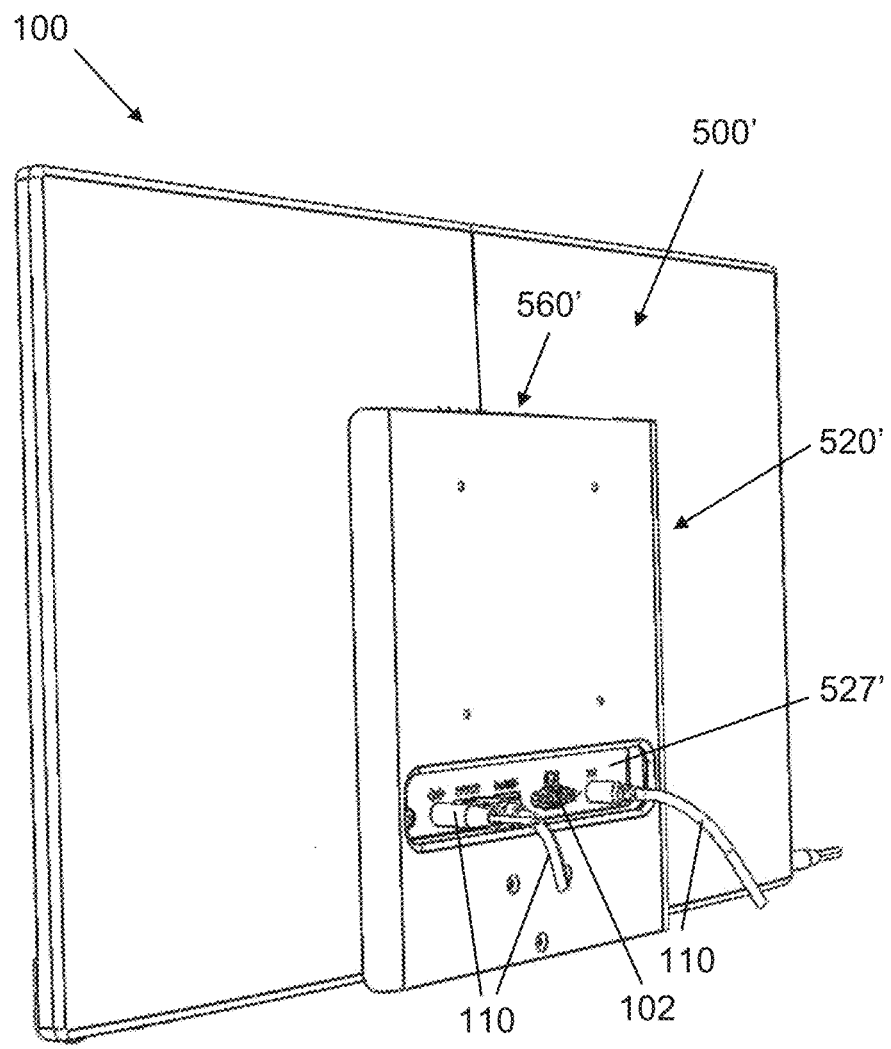
FIGS. 7A and 7B illustrate rear perspective views of one example of a mount adapter secured to a display device.
Figure 7B:
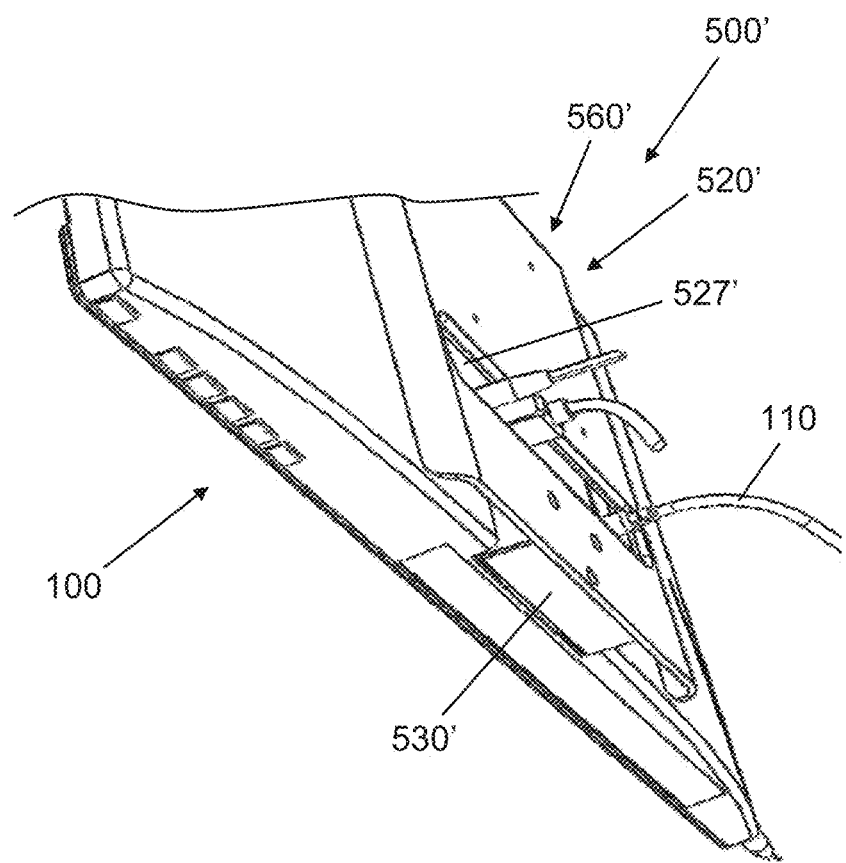

FIGS. 7A and 7B illustrate rear perspective views of one example of a mount adapter, such as mount adapter 500', secured or attached to (i.e., installed on) a display device, such as display device 100. In one example, mount adapter 500' is secured or attached to display device 100 by inserting engagement tongue 540 or engagement tongue 640 (FIG. 6) into a receiving slot, such as receiving slot 106 (FIG. 3A), of display device 100, in a manner similar to that described above.

As illustrated in the example of FIGS. 7A and 7B, mount adapter 500' is similar to mount adapter 500, and includes a mounting plate 520' with a connector access and cable pass-through opening 527' that provides access to connectors 102 of display device 100 when mount adapter 500' is secured or attached to display device 100. As such, one or more cables 110 may be connected to connectors 102 of display device 100 through mounting plate 520'.

In addition, similar to mounting interface 560 of mounting plate 520, mounting plate 520' includes a mounting interface 560'. Thus, with mount adapter 500' secured or attached to display device 100, mount adapter 500' provides display device 100 with a mounting interface. As such, display device 100, via mount adapter 500' and mounting interface 560', may be secured or mounted on or to a supporting object or structure such as, for example, a wall, a wall mount or bracket, an arm, a stand, or other mounting structure.

In one example, as illustrated in FIG. 7B, mount adapter 500', similar to mount adapter 500, includes a spacer 530' interposed between mounting plate 520' and an engagement tongue, such as engagement tongue 540 (FIG. 5A). As such, spacer 530' provides a filler block for a recessed area or void 108 of display device 100 (FIG. 1B). In one example, recessed area or void 108 remains or is exposed or revealed when a stand of display device 100 (for example, a desktop stand) of display device 100 is removed. In one example, the stand is removed so that display device 100 can accommodate a mount adapter, such as mount adapter 500', and be secured or mounted on or to a supporting object or structure such as, for example, a wall, a wall mount or bracket, an arm, a stand, or other mounting structure.

Figure 8:
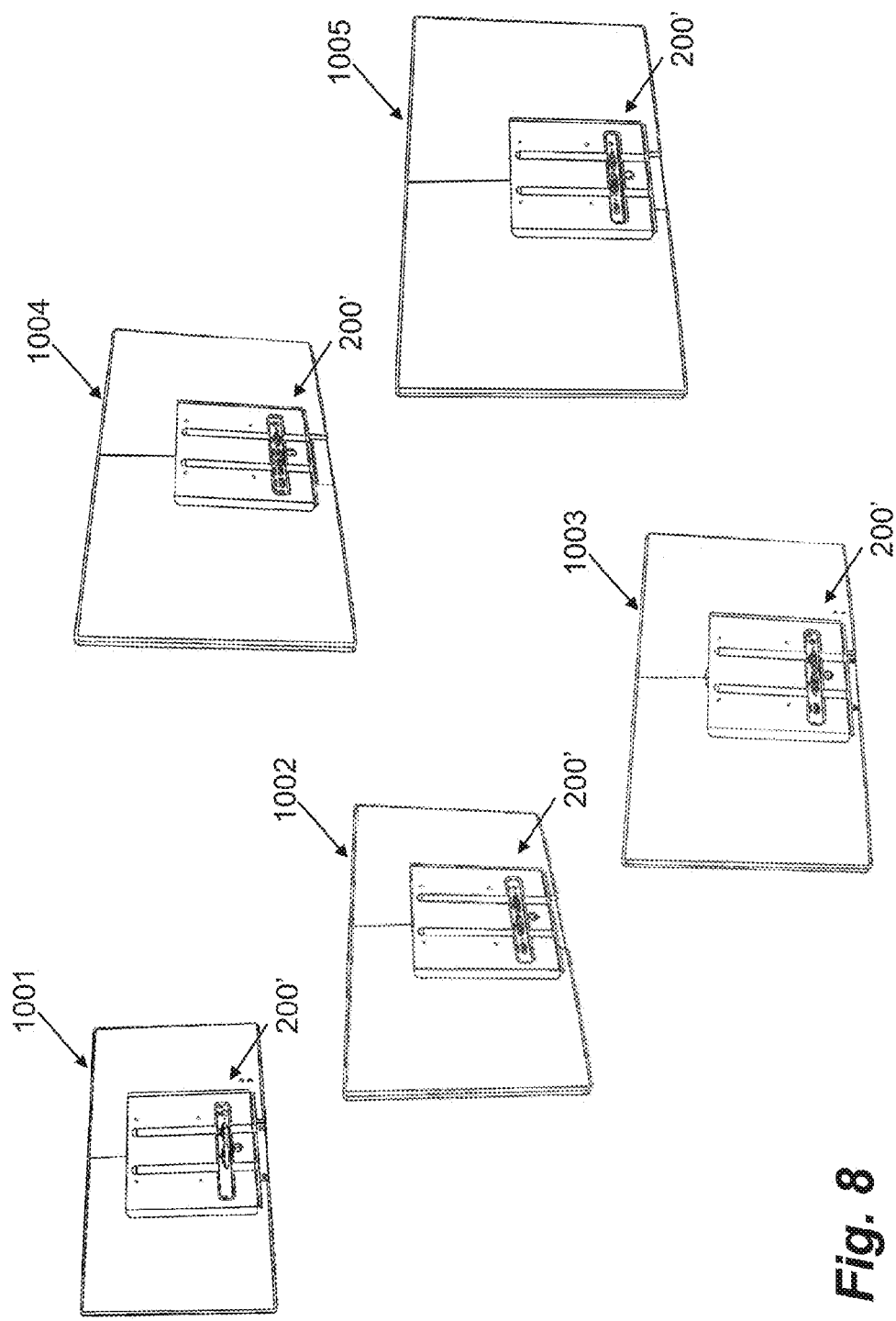
FIG. 8 illustrates rear perspective views of examples of mount adapters secured to different display devices.

FIG. 8 illustrates rear perspective views of examples of a mount adapter, such as mount adapter 200', secured to different display devices, such as display devices 1001, 1002, 1003, 1004, and 1005. The different display devices may include, for example, different sized display devices. In one example, display device 1001 includes a 20" display device, display device 1002 includes a 22" display device, display device 1003 includes a 23" display device, display device 1004 includes a 25" display device, and display device 1005 includes a 27" display device. In one implementation, one mount adapter is used, for example, for display devices 1001, 1002, and 1003, and another, different mount adapter is used, for example, for display devices 1004 and 1005. The different mount adapter may include, for example, a different engagement tongue, as described above.

Mount adapters 200, 200', 400, 500, and 500', as illustrated and described herein, facilitate mounting of a display device, such as display device 100, on or to a supporting object or structure such as, for example, a wall, a wall mount or bracket, an arm, a stand, or other mounting structure. By providing the mount adapters with different engagement tongues, the mount adapters may be used with different display devices. As such, the mount adapters may provide an adapter system for mounting of a variety of display devices. In one implementation, the mount adapters provide for VESA mounting capability to interface with various mounts, mounting pads, brackets or other mounting apparatus provided, for example, by various mounting equipment manufacturers.

Although specific examples have been illustrated and described herein, it will be appreciated by those of ordinary skill in the art that a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A display device mount adapter, comprising:
a bottom base portion having a primary surface between a first long edge and a second long edge;
a mounting plate extending upwards perpendicularly from the primary surface of the bottom base portion at the first long edge and having a mounting interface; and
an engagement tongue extending upwards perpendicularly from the primary surface of the bottom base portion at the second long edge and connected to and spaced from the mounting plate via the bottom base portion,
wherein the engagement tongue comprises:
a plurality of prongs; and
a middle portion between the prongs, a thickness of the middle portion less than a thickness of the prongs, a top surface of the middle portion flush with a top surface of the prongs, the middle portion having a notch at the top surface of the middle portion,
and wherein the notch and the prongs are adapted to engage corresponding features of a slot of a display device to secure the mount adapter to the display device.

2. The mount adapter of claim 1, wherein the mounting interface comprises a multi-hole mounting pattern.

3. The mount adapter of claim 1, wherein the mounting plate has an opening therethrough to provide access to an electrical connector of the display device.

4. The mount adapter of claim 1, wherein the mounting plate has an opening therethrough to provide access to a mount release of the display device.

5. The mount adapter of claim 1, wherein the engagement tongue is integrally formed with the mounting plate and the bottom base portion.

6. The mount adapter of claim 1, wherein the engagement tongue, the mounting plate, and the bottom base portion are removably coupled to one another.

7. A mounting adapter for a display device, comprising:
a bottom base portion;

a mounting plate extending upwards perpendicularly from the bottom base portion and including a mounting interface; and an engagement tongue coupled with the mounting plate to secure the mounting plate with the display device, the engagement tongue extending upwards perpendicularly from the bottom base portion less than the mounting plate extends upwards perpendicularly from the bottom base portion, the engagement tongue offset from the mounting plate via the bottom base portion, wherein the engagement tongue comprises:

a plurality of prongs; and a middle portion between the prongs, a thickness of the middle portion less than a thickness of the prongs, a top surface of the middle portion flush with a top surface of the prongs, the middle portion having a notch at the top surface of the middle portion, and wherein the notch and the prongs are adapted to engage corresponding features of a slot of a display device to secure the mount adapter to the display device.

8. The mounting adapter of claim 7, wherein the mounting interface comprises a multi-hole mounting pattern.

9. The mounting adapter of claim 7, wherein the mounting plate has at least one opening therethrough for access to at least one of an electrical connector of the display device and a mount release of the display device.

10. The mounting adapter of claim 7, wherein the mounting plate includes a mounting cushion to contact the display device.

11. A system, comprising:

a display device having a top and a bottom; and a mount adapter including a mounting plate and a tongue spaced from and coupled with the mounting plate, the mounting plate having a mounting interface, and the tongue to be received by the display device to secure the mount adapter to the display device, the mounting plate positioned on the display device closer to the top than the tongue is positioned on the display device, wherein the tongue comprises:

a plurality of prongs; and a middle portion between the prongs, a thickness of the middle portion less than a thickness of the prongs, a top surface of the middle portion flush with a top surface of the prongs, the middle portion having a notch at the top surface of the middle portion, and wherein the notch and the prongs are adapted to engage corresponding features of a slot of a display device to secure the mount adapter to the display device.

12. The system of claim 11, wherein the mounting interface comprises a multi-hole mounting pattern.

13. The system of claim 11, wherein the tongue is to engage a slot of the display device in a direction substantially parallel with a mounting surface of the mounting plate.

14. The system of claim 11, wherein the tongue comprises an interchangeable tongue to accommodate different display devices.

15. The system of claim 11, wherein the mount adapter provides access to at least one of an electrical connector of the display device and a mount release of the display device through the mounting plate.

16. The display device mount adapter of claim 1, wherein the mounting interface is to secure the mounting plate to the display device.

17. The display device mount adapter of claim 16, wherein the mounting interface comprises a hole corresponding to a hole of the display device and receptive to insertion of a fastening member therethrough and into the hole of the display device to secure the mounting plate to the display device.

18. The display device mount adapter of claim 1, wherein each prong comprises:

a tip having a top surface flush with the top surface of the prong;

a shoulder having a top surface below the top surface of the tip, the prong having a width at the shoulder greater than a width at the tip.

19. The display device mount adapter of claim 1, wherein a distance between the top surface of the shoulder and the top surface of the tip corresponds to a size of the display device to which the mount adapter is secured.

* * * * *